United States Patent [19]

Wronski et al.

[11] 4,149,907

[45] Apr. 17, 1979

[54] METHOD OF MAKING CAMERA TUBE TARGET BY MODIFYING SCHOTTKY BARRIER HEIGHTS

[75] Inventors: Christopher R. Wronski; Benjamin Abeles, both of Princeton, N.J.

[73] Assignee: RCA Corporation, New York, N.Y.

[21] Appl. No.: 833,752

[22] Filed: Sep. 16, 1977

Related U.S. Application Data

[60] Division of Ser. No. 813,675, Jul. 7, 1977, abandoned, which is a continuation of Ser. No. 558,259, Mar. 14, 1975, abandoned.

[51] Int. Cl.² .................... H01L 21/26; H01L 31/06
[52] U.S. Cl. ........................................ 148/1.5; 357/15; 357/31; 357/91
[58] Field of Search .............. 148/1.5; 357/15, 91, 357/31

[56] References Cited

U.S. PATENT DOCUMENTS

| | | | |
|---|---|---|---|
| 2,688,564 | 9/1954 | Forgue | 117/33.21 |
| 3,634,692 | 1/1972 | Padovani et al. | 250/211 J |
| 3,716,406 | 2/1973 | Scholl et al. | 117/217 |
| 3,928,865 | 12/1975 | Yamashita | 357/30 |
| 3,964,084 | 6/1976 | Andrews, Jr. et al. | 357/15 |
| 3,967,151 | 6/1976 | Robusto et al. | 313/398 |
| 4,035,197 | 7/1977 | Raychaudhuri | 136/89 CD |
| 4,045,248 | 8/1977 | Shannon et al. | 148/1.5 |

OTHER PUBLICATIONS

Wronski et al., "Granular Metal-Semiconductor Schottky Barriers", J. Appl. Phys. 45 (1974) 295.
Favennec et al., "Compensation of GaAs by $O_2$-Impl$^n$", Ion-Impl$^n$ in S/C . . . ", Ed. B. Crowder, Plen. Pr., N.Y., 1972.
"Thin Film Cermets . . . ", Electronics, Oct. 1970, pp. 39–41.
Mehta et al., ". . . CdSe Films . . . Schottky Barriers . . . ", J. Appl. Phys. 44, (1973) 325.

*Primary Examiner*—L. Dewayne Rutledge
*Assistant Examiner*—Upendra Roy
*Attorney, Agent, or Firm*—E. M. Whitacre; G. H. Bruestle; R. M. Rodrick

[57] ABSTRACT

A photoconductor body for a camera tube includes a semiconductor body including an overlayer of a material selected from a granular metal-insulator system. Suitable semiconductor materials are limited to those materials capable of providing Schottky barrier heights in excess of 0.9 eV. when fabricated with such overlayers and those having bandgaps greater than about 1.4 eV. A method of fabricating such photoconductive bodies is disclosed wherein a cadmium selenide semiconductor material is thermally treated to modify the Schottky barrier heights to a desired value in excess of about 0.9 eV.

7 Claims, 1 Drawing Figure

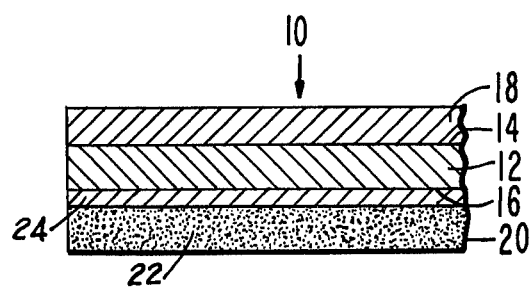

METHOD OF MAKING CAMERA TUBE TARGET BY MODIFYING SCHOTTKY BARRIER HEIGHTS

This is a division of application Ser. No. 813,675, filed July 7, 1977, now abandoned, entitled CAMERA TUBE TARGET INCLUDING A SCHOTTKY BARRIER which is a continuation of application Ser. No. 558,259, filed Mar. 14, 1975, now abandoned, entitled CAMERA TUBE TARGET INCLUDING A SHOTTKY BARRIER.

BACKGROUND OF THE INVENTION

The invention relates to low dark current type photoconductors and more particularly to improvements in targets for camera tubes of the type described in the abandoned U.S. application No. 513,392 by A. Rose entitled "Photoconductor for Imaging Devices" filed on Oct. 9, 1974, and herein incorporated by reference, which include metal-to-semiconductor Schottky barriers as blocking contacts.

DESCRIPTION OF THE DRAWING

The FIGURE of the drawing is an exaggerated sectional view of a target for a camera tube.

DETAILED DESCRIPTION

Referring to the FIGURE of the drawing, there is shown a target 10 for a camera tube. The target 10 comprises a substantially flat light receiving body 12 of a photoconductive semiconductor material, such as hereinafter described, having opposed surfaces 14 and 16. On the surface 14 of the semiconductor body 12 is a layer 18 of a transparent conductive material, such as a metal or tin oxide.

On the surface 16 of the semiconductor body 12 is a layer 20 of a material selected from a granular metal-insulator system, i.e., a mixture, or combination, of an insulator material with substantially uniformly dispersed granular metal particles 22. The density (i.e. "particulate concentration") of granular metal particles within a particular insulator material may be selected in accordance with the desired: carrier density, mobility of the carriers, and surface resistivity. The well known cermets, which are small particles of conductive metal dispersed throughout a matrix of a glass, or other ceramic-like material, are materials of a granular metal-insulator system which are particularly preferred for the composition of the layer 20.

The cermets which are suitable include those which are formed by co-depositing, either by sputtering or vacuum evaporation, a conductive metal such as gold, silver, copper, tungsten, aluminum, etc., and an insulator, such as silicon dioxide and aluminum oxide; or of the type wherein a mixture of the metal particles and a glass frit, or other sealing glass material, is applied and fired onto the surface of the semiconductor body 12. Generally, for a camera tube, the particulate concentration should be selected to achieve a lateral resistance in excess of about $10^{13}$ ohms per square. Further, the resistivity of layer 20 should be less than about $5 \times 10^{10}$ ohm-cm, for the dielectric relaxation time to be less than one frame period. A preferred thickness for the layer 20 is on the order of from 100Å–4000Å thick; however, other thicknesses which are in excess of the range specified may be employed to advantage.

In the target 10, each of the metal particles 22 of the layer 20 acts as a single charge carrier. Various ones of these particles 22 which abut (i.e. which are closely proximate to, or in contact with) the semiconductor body 12 provide a metal-semiconductor interface whereby a Schottky barrier may be provided which serves to collect the electrons from the scanning electron beam of an operative camera tube, such as described in the aforementioned abandoned application of A. Rose, and block the flow of the electrons from the scanning beam into the semiconductor body 12 (i.e. forms a "blocking contact").

In the fabrication of targets such as described above, the material of the semiconductor body 12 must be selected with care in order to insure adequate operation as a target when assembled within an operative camera tube. Dark current levels less than about $10^{-9}$ A/cm$^2$ are desired and may only be achieved when the Schottky barrier height at the interface region between each of the abutting metal particles 22 of layer 20 and the semiconductor body 12 exceeds about 0.9 eV. Further, we have found that the semiconductor body 12 must possess a sufficiently high lateral resistance along the semiconductor body surface 16 which interfaces with the layer 20 to prevent loss of resolution. In this regard, we find that the bandgap of the semiconductor must exceed about 1.4 eV. in order to accomplish this result. More specifically, the bandgap of the semiconductor material must be such that Eg-$\phi_b \geq 0.5$ eV., where "Eg" is the bandgap and $\phi_b$ is the Schottky barrier height. Moreover, if the target 10 is to be sensitive over the entire visible spectrum (i.e. 4000Å–7000Å) the bandgap of the semiconductor 12 must be less than about 1.8 eV. Thus the bandgap of suitable semiconductor materials for the target 10 must be greater than about 1.4 eV. but less than about 1.8 eV. where the target is to be responsive to the entire visible spectrum. Also, in order to minimize capacitance lag to less than about 10%, the capacitance of the target must be less than about 4000 pF./cm$^2$ and the thickness of the semiconductor must exceed about 2 microns. Preferably, the thickness of the semiconductor should exceed about 5 microns to achieve a more ideal capacitance value of less than 1500 pF./cm$^2$.

An operable example of the target 10 was constructed wherein the body 12 consisted of a base layer of polycrystalline CdSe approximately 2 microns thick which was vapor deposited along a tin oxide conductive coating previously fabricated along a major surface of faceplate in a manner well known in the art. The layer 20 consisted of a sputter deposited overlayer of an Au-SiO$_2$ cermet, having a thickness of approximately 4000 Å and a resistivity of about $10^9 \Omega$-cm., on a major exposed surface of the base layer. Gold particles 22 having an average size on the order of 25 Å were embedded in amorphous SiO$_2$ having a metal particulate concentration of about 10% by volume of the Au-SiO$_2$ material. Particulate concentrations of from 8 to 13% by volume could also have been employed to advantage.

In fabrication, the surface 16 of the CdSe base layer (i.e. body 12) was, for example, initially treated, or modified as shown in the drawing, to provide a conductivity-modifier 24 of oxygen along the surface region proximate thereto for achieving the desired barrier height in excess of 0.9 eV. in the completed target 10. In the example described, the electronic states of the cadmium selenide semiconductor body 12 along and proximate to the surface 16 were modified prior to the sputter deposition of layer 20 by a suitable thermal surface treatment in an atmosphere including oxygen. More specifically a barrier height of about 1 eV. was achieved by lightly oxidizing the surface 16 by baking the body 12 in air at about 350° C. for about 30 minutes. Alternatively, the suitable surface conductivity modifier 24 could be incorporated within the target 10 by the separate application of a monolayer, or more, or of a material (e.g. copper) other than that of the semiconductor of the body 12, or the layer 20, along the surface 16 or the surface region proximate thereto to produce the desired increase in the barrier height.

Alternative structures, similar to the example described, may be fabricated with other semiconductor materials which may be fabricated with the layer 20 to provide a barrier height in excess of 0.9 eV. at the metal-semiconductor interface. For example, the semiconductor body 12 may consist of cadmium telluride, or gallium arsenide, and alloys thereof. Such materials are known to possess bandgaps of less than 1.8 eV. and are known to form metal-to-semiconductor barrier heights less than 0.9 eV. However, such materials may also be modified in a manner, for example, similar to one of those described above, during the fabrication of the target 10 to possess barrier heights exceeding the necessary 0.9 eV. Targets fabricated in this manner would be photo-sensitive across the entire visible spectrum. Other semiconductor materials having bandgaps of greater than 1.8 eV. (e.g. Gallium Phosphide, Cadmium Sulfide, and Gallium Phosphide—Gallium Arsenide Alloys,) may be employed in similar target structures to advantage wherein restricted sensitivities within the visible spectrum are desired.

Low dark currents on the order of $10^{-9}$ A/cm$^2$ have been achieved for the novel target structure without substantially sacrificing other commercially desired electrical characteristics such as: lag, resolution, sensitivity, and range of operating voltages.

What we claim is:

1. A method of fabricating a target for a camera tube including a semiconductor body having opposed major surfaces and having a bandgap greater than about 1.4 ev and less than about 1.8 ev and a layer of transparent conductive material along one of said major surfaces of said body, including the steps of:

(a) incorporating a conductivity modifier along the other major surface of the semiconductor body to achieve a barrier height exceeding 0.9 ev and less than said bandgap by at least 0.5 ev whenever a metal body is abutted therewith which is capable of forming a metal-semiconductor blocking contact, (b) codepositing insulating material and conductive metal particles to form a layer having said conductive particles dispersed throughout along said treated surface wherein a plurality of said metal particles abut a surface region of said semiconductor body whereby a metal-semiconductor blocking contact may be achieved therebetween having a barrier height exceeding about 0.9 ev.

2. The method of claim 1 wherein said semiconductor consists of a material selected from the group consisting of cadmium selenide, cadmium telluride, and gallium arsenide.

3. The method of claim 2 wherein said semiconductor material is polycrystalline cadmium selenide.

4. The method of claim 3 wherein said step of incorporating said conductivity modifier comprises the step of thermally treating said surface region in an atmosphere containing oxygen.

5. The method of claim 4 wherein said thermal treating step comprises thermally treating said major surface of the semiconductor body in air at a temperature of about 350° C. for a period of time of about 30 minutes.

6. The method of claim 3, wherein said step of incorporating a conductivity modifier comprises the step of depositing along said major surface of the semiconductor body at least one monolayer of a material capable of achieving said barrier height, said material being dissimilar from that of said semiconductor body and layer, whereby said barrier height may be achieved.

7. The method of claim 6 wherein said conductivity modifier comprises copper.